US010012698B1

(12) United States Patent
Pulley et al.

(10) Patent No.: US 10,012,698 B1
(45) Date of Patent: Jul. 3, 2018

(54) PORTABLE TEST UNIT WITH LOAD

(71) Applicant: Amazon Technologies, Inc., Seattle, WA (US)

(72) Inventors: Justin Lee Pulley, Auburn, WA (US); Hoang Pham, Seattle, WA (US); Jared Joseph Lee, Marysville, WA (US); John William Eichelberg, Spokane, WA (US)

(73) Assignee: Amazon Technologies, Inc., Seattle, WA (US)

( * ) Notice: Subject to any disclaimer, the term of this patent is extended or adjusted under 35 U.S.C. 154(b) by 415 days.

(21) Appl. No.: 14/670,347

(22) Filed: Mar. 26, 2015

(51) Int. Cl.
*G01R 31/02* (2006.01)
*G01R 31/327* (2006.01)
*H02J 9/06* (2006.01)
*G01R 31/40* (2014.01)

(52) U.S. Cl.
CPC ..... *G01R 31/3278* (2013.01); *G01R 31/3272* (2013.01); *H02J 9/061* (2013.01); *G01R 31/327* (2013.01); *G01R 31/40* (2013.01)

(58) Field of Classification Search
CPC .............. G01R 31/3278; G01R 31/327; G01R 31/3272; G01R 31/40; H02J 9/061; H02H 3/335
USPC ....... 324/415, 418, 423, 416, 417, 419, 422, 324/424, 500, 512, 522, 523, 527, 528, 324/537, 538, 555; 361/245, 246, 139, 361/160, 189
See application file for complete search history.

(56) References Cited

U.S. PATENT DOCUMENTS 4,256,972 A * 3/1981 Wyatt .................... G01R 29/18
307/152
4,405,867 A * 9/1983 Moakler ................... H02J 9/06
307/64

(Continued)

OTHER PUBLICATIONS

ASCO, Suggested Specification for Automatic Transfer Switches—Division 16—Electrical Standby Power Generator Systems, Automatic Switch Co. May 1996.*

(Continued)

*Primary Examiner* — Patrick Assouad
*Assistant Examiner* — Sean Curtis
(74) *Attorney, Agent, or Firm* — Kilpatrick Townsend & Stockton LLP

(57) ABSTRACT

Systems, devices, and related methods for automated testing of an automatic transfer switch. A device for testing an automatic transfer switch includes a primary power supply input, a controlled primary power output, a primary power source selection assembly, an output electrical power monitor unit, and a control input. The power source selection assembly is controllable to enable selective communication of electrical power received via the primary power supply input to the controlled primary power output. The output electrical power monitor unit is configured to monitor electrical power supplied to a connected load via the automatic transfer switch. The control input is operatively coupled with the primary power source selection assembly and the output electrical power monitor unit to enable control of the operation of the primary power source selection assembly via an external controller and to transfer output from the output electrical power monitor unit to the external controller.

20 Claims, 9 Drawing Sheets

(56) References Cited

U.S. PATENT DOCUMENTS

| | | | |
|---|---|---|---|
| 5,784,240 A * | 7/1998 | Przywozny | H01H 51/08 307/127 |
| 6,172,432 B1 * | 1/2001 | Schnackenberg | H02J 3/14 307/125 |
| 6,590,752 B1 * | 7/2003 | Schaper | G05B 19/0428 361/23 |
| 6,731,484 B2 * | 5/2004 | Pebles | H02J 9/06 361/118 |
| 6,747,368 B2 * | 6/2004 | Jarrett, Jr. | H02J 9/06 307/31 |
| 6,849,811 B1 * | 2/2005 | Heflin | H01H 1/225 200/1 R |
| 6,980,911 B2 * | 12/2005 | Eaton | H02J 3/005 324/96 |
| 7,208,955 B2 * | 4/2007 | Zansky | G01R 31/3277 324/418 |
| 7,239,045 B2 * | 7/2007 | Lathrop | H02J 3/005 307/141 |
| 7,352,082 B2 * | 4/2008 | Marwali | H02J 9/06 307/52 |
| 7,397,212 B2 * | 7/2008 | Turner | H02P 23/14 318/561 |
| 7,511,474 B2 * | 3/2009 | Washington | H02J 9/061 318/286 |
| 7,521,884 B2 * | 4/2009 | Filippenko | H02J 9/061 318/400.03 |
| 7,642,676 B2 * | 1/2010 | Washington | H01H 1/0015 307/130 |
| 8,222,548 B2 * | 7/2012 | Espeut, Jr. | H01H 9/26 200/50.33 |
| 8,407,017 B2 * | 3/2013 | Hancock | G01R 31/42 702/62 |
| 8,433,531 B2 * | 4/2013 | Hancock | G01R 31/42 702/62 |
| 8,483,982 B2 * | 7/2013 | Hancock | G01R 31/40 702/60 |
| 8,670,872 B2 * | 3/2014 | Rasmussen | H02J 9/06 307/70 |
| 8,766,489 B2 * | 7/2014 | Lathrop | H02J 3/06 307/125 |
| 8,903,674 B2 * | 12/2014 | Hancock | G01R 31/42 702/122 |
| 9,103,895 B2 * | 8/2015 | Hancock | G01R 31/42 |
| 9,419,473 B2 * | 8/2016 | Tomassi | H02J 9/06 |
| 9,509,139 B1 * | 11/2016 | Flegel | H02J 9/066 |
| 9,563,217 B2 * | 2/2017 | Loucks | H02J 9/061 |
| 9,570,253 B1 * | 2/2017 | Hamilton | H01H 11/0062 |
| 9,594,125 B1 * | 3/2017 | Waldron | G01R 31/40 |
| 9,692,254 B2 * | 6/2017 | Tomassi | H02J 9/061 |
| 2003/0075982 A1 * | 4/2003 | Seefeldt | H02J 9/06 307/29 |
| 2004/0172204 A1 * | 9/2004 | Eaton | H02J 3/005 702/57 |
| 2005/0134121 A1 * | 6/2005 | Lathrop | H02J 3/005 307/80 |
| 2005/0216131 A1 * | 9/2005 | Sodemann | H02G 3/00 700/295 |
| 2006/0028069 A1 * | 2/2006 | Loucks | H02J 3/005 307/130 |
| 2006/0212745 A1 * | 9/2006 | Zansky | G01R 31/3277 714/6.12 |
| 2007/0055409 A1 * | 3/2007 | Rasmussen | H02J 9/06 700/286 |
| 2008/0100146 A1 * | 5/2008 | Washington | H01H 1/0015 307/130 |
| 2008/0100245 A1 * | 5/2008 | Turner | H02P 23/14 318/437 |
| 2008/0100248 A1 * | 5/2008 | Filippenko | H02J 9/061 318/466 |
| 2008/0116898 A1 * | 5/2008 | Washington | H02J 9/061 324/521 |
| 2008/0313006 A1 * | 12/2008 | Witter | G06Q 10/063118 705/7.17 |
| 2010/0010684 A1 * | 1/2010 | Lorenz | H02H 7/06 700/293 |
| 2010/0019574 A1 * | 1/2010 | Baldassarre | H02J 3/14 307/23 |
| 2010/0038966 A1 * | 2/2010 | Espeut, Jr. | H01H 9/26 307/68 |
| 2012/0110386 A1 * | 5/2012 | Hancock | G01R 31/40 714/41 |
| 2012/0146417 A1 * | 6/2012 | Rasmussen | H02J 9/06 307/64 |
| 2012/0235512 A1 * | 9/2012 | Siciliano | H01H 11/0062 307/112 |
| 2013/0049476 A1 * | 2/2013 | Lathrop | H02J 3/06 307/80 |
| 2013/0158932 A1 * | 6/2013 | Witter | G06Q 10/063118 702/108 |
| 2014/0111006 A1 * | 4/2014 | Baldassarre | H02J 9/002 307/23 |
| 2015/0008740 A1 * | 1/2015 | Batzler | G05B 23/0216 307/23 |
| 2015/0168975 A1 * | 6/2015 | Loucks | H02J 9/061 700/296 |
| 2015/0180275 A1 * | 6/2015 | Tomassi | H02J 9/06 307/64 |
| 2015/0214779 A1 * | 7/2015 | Tomassi | H02J 9/061 307/65 |
| 2016/0048277 A1 * | 2/2016 | Scott | H02J 13/001 715/771 |
| 2016/0343526 A1 * | 11/2016 | Schicke, II | H01H 47/002 |
| 2016/0379768 A1 * | 12/2016 | Pham | G06F 1/30 307/142 |
| 2017/0154745 A1 * | 6/2017 | Hamilton | H01H 47/22 |

OTHER PUBLICATIONS

Yeniu et al., Design and Application of Test System for Solid State Transfer Switch, State Grid Beijing Electric Power Institute, 2014 China International Conference on Electricity Distribution (CICED 2014). Sep. 2014.*

Testguy, Transfer Switch Testing and Maintenance Guide, Aug. 14, 2016, www.testguy.net.*

Testguy, Transfer Switch Testing and Maintenance Guide, Aug. 4, 2016, https://testguy.net , vBulletin Soluions, Inc.*

* cited by examiner

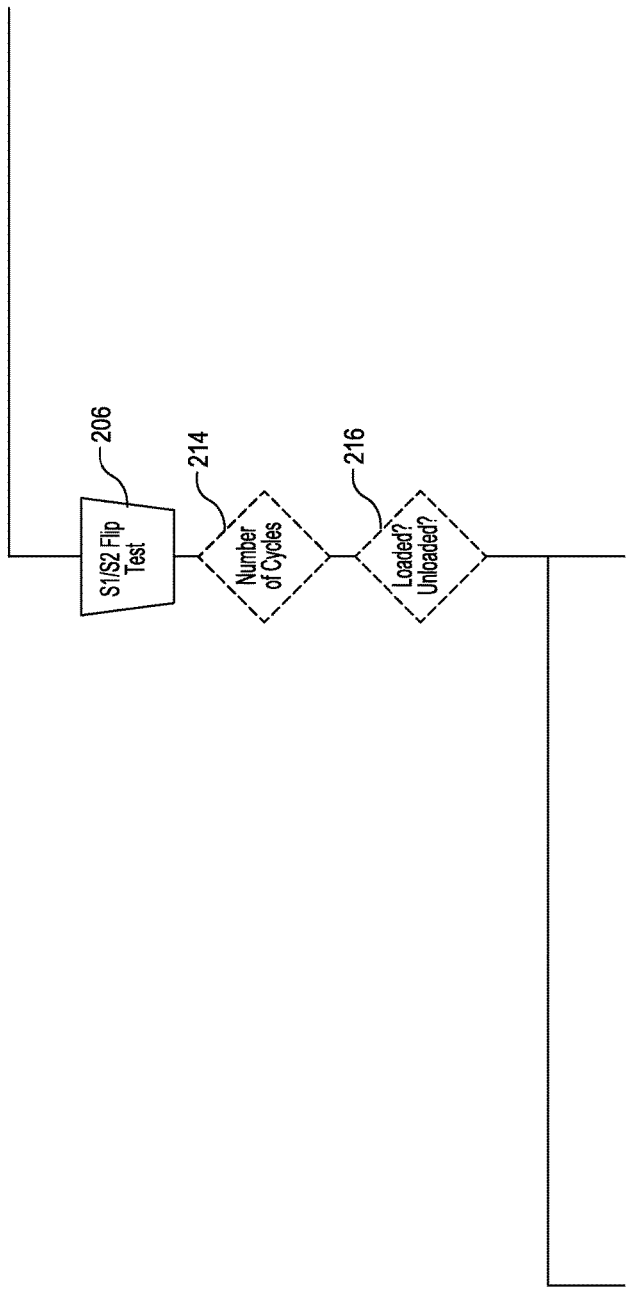

PORTABLE TEST UNIT WITH LOAD

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers, which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As a result, it is a common expectation that a datacenter's computer resources be available, even in the event of utility power failures.

BRIEF DESCRIPTION OF THE DRAWINGS

Various embodiments in accordance with the present disclosure will be described with reference to the drawings, in which.

DETAILED DESCRIPTION

Figure 1:
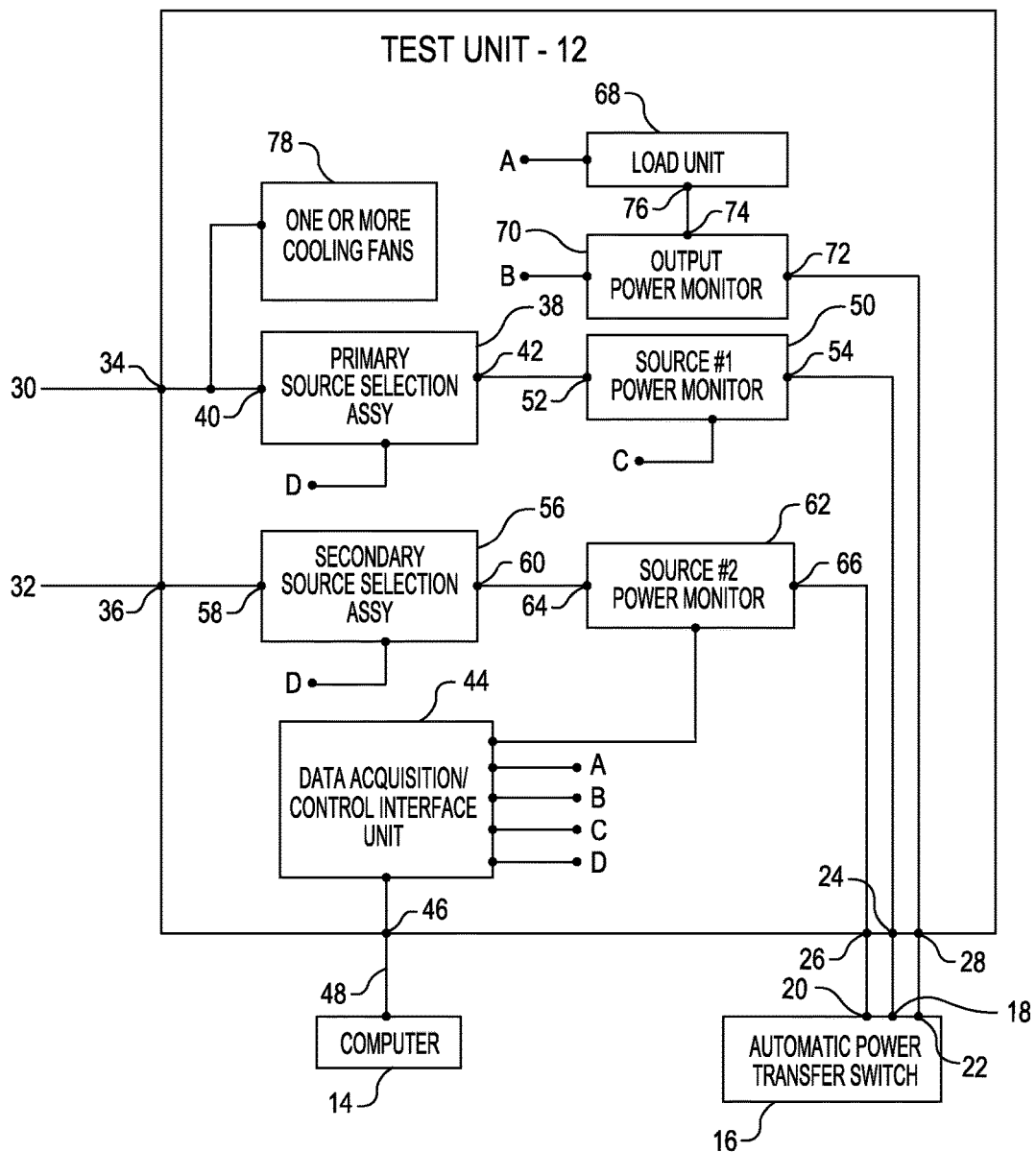
FIG. 1 schematically illustrates a system for testing an automatic power supply transfer switch, in accordance with many embodiments.

In the following description, various embodiments will be described. For purposes of explanation, specific configurations and details are set forth in order to provide a thorough understanding of the embodiments. It will, however, also be apparent to one skilled in the art that the embodiments may be practiced without the specific details. Furthermore, well-known features may be omitted or simplified in order not to obscure the embodiment being described.

Methods, systems and test units are provided for testing one or more automatic power transfer switches (also referred to herein as "automatic transfer switches" or "automatic power supply transfer switches"). In many embodiments, the testing is automated and used to check whether the switching time for the automatic power transfer switch is within a desired and/or specification range. The switching time is the amount of time it takes for the automatic transfer switch to start outputting electrical power received via a secondary power source input after supply of electrical power to a primary power source input has stopped. In many embodiments, testing can be performed to measure additional performance characteristics of an automatic power transfer switch including, but not limited to, a reversion switching time (the time it takes for the automatic power transfer switch to revert back to supplying electrical power received via the primary power source input following restart of supply of electrical power to the primary power source input) and power transmission efficiency. In many embodiments, one or more automatic power transfer switches are connected with a test unit that is computer controlled to perform automated testing and measure performance related data for the one or more automatic power transfer switches, thereby providing faster testing relative to non-automated approaches as well as additional performance related data.

Thus, in one aspect, a method is provided for testing an automatic power supply transfer switch having a power output configured to supply electrical power to a connected load, a primary power input for receiving electrical power from a primary power source, and a secondary power input for receiving electrical power from a secondary power source. The automatic power supply transfer switch automatically switches between supplying power to the connected load via power received via the primary power input and supplying power to the connected load via power received via the secondary power input based on availability of electrical power from the primary power source. The method includes supplying electrical power from the primary power source to one or more primary power source selection relays. Electrical power is supplied from the secondary power source to the secondary power input of the automatic power supply transfer switch. The one or more primary power source selection relays are controlled to supply electrical power from the primary power source to the primary power input of the automatic power supply transfer switch. Electrical power is supplied to a connected load via the power output of the automatic power supply transfer switch. The one or more primary power source selection relays are controlled to stop supplying electrical power from the primary power source to the primary power input of the automatic power supply transfer switch. Voltage and current of the power supplied to the connected load via the power output of the automatic power supply transfer switch is monitored. Based at least in part on the monitored voltage and current of the power supplied to the connected load via the power output, a switching time for the automatic power supply transfer switch is determined based on the time between (a) when supply of electrical power from the primary power source to the primary power input of the automatic power supply transfer switch is stopped, and (b) when the automatic power supply transfer switch starts to supply electrical power from the secondary power source received via the secondary power input to the connected load.

In many embodiments, the method for testing an automatic power supply transfer switch includes determining a power transfer efficiency for the automatic transfer switch. For example, the method can include: (1) monitoring voltage and current of the power supplied from the primary power source to the primary input of the automatic power supply transfer switch; and (2) determining a power transfer efficiency for the automatic power supply transfer switch based on (a) the voltage and current of the power supplied to the connected load via the power output of the automatic power supply transfer switch, and (b) the voltage and current of the power supplied from the primary power source to the primary input of the automatic power supply transfer switch.

In many embodiments, the method for testing an automatic power supply transfer switch includes determining power transfer efficiency for two or more connected load levels. For example, the method can include changing a magnitude of the connected load to a second load magnitude. A second power transfer efficiency for the automatic power supply transfer switch is determined based on (a) the voltage and current of the power supplied to the connected load having the second load magnitude via the power output of the automatic power supply transfer switch, and (b) the voltage and current of the power supplied from the primary power source to the primary input of the automatic power supply transfer switch.

In many embodiments, the method includes determining a reversion switching time for the automatic power supply transfer switch. For example, after controlling the one or more primary power source selection relays to stop supplying electrical power from the primary power source to the primary power input of the automatic power supply transfer switch, the one or more primary power source selection relays can be controlled to restart supplying electrical power from the primary power source to the primary power input of the automatic power supply transfer switch. A reversion switching time for the automatic power supply transfer switch is determined based on the time between (a) when supply of electrical power from the primary power source to the primary power input of the automatic power supply transfer switch is restarted, and (b) when the automatic power supply transfer switch reverts to supplying electrical power from the primary power source received via the primary power input to the connected load.

In another aspect, a second method is provided for testing an automatic power transfer switch. The second method includes supplying electrical power to a secondary power input of the automatic power supply transfer switch. Electrical power is supplied to a primary power source selection assembly of the automatic power supply transfer switch. The primary power source selection assembly is controlled to supply electrical power to a primary power input of the automatic power supply transfer switch. Electrical power is supplied to a connected load via the automatic power supply transfer switch. The primary power source selection assembly is controlled to stop supplying electrical power to the primary power input of the automatic power supply transfer switch. The power supplied via the power output of the automatic power supply transfer switch to the connected load is monitored. Based at least in part on the monitored power supplied via the power output of the automatic power supply transfer switch to the connected load, a switching time is determined for the automatic power supply transfer switch.

In many embodiments, the second method for testing an automatic power supply transfer switch includes determining a power transfer efficiency for the automatic transfer switch. For example, the power supplied to the primary input of the automatic power supply transfer switch can be monitored. A power transfer efficiency for the automatic power supply transfer switch can be determined based on (a) the power supplied to the connected load via the automatic power supply transfer switch, and (b) the power supplied to the primary input of the automatic power supply transfer switch.

In many embodiments, the second method for testing an automatic power supply transfer switch includes determining power transfer efficiency for two or more connected load levels. For example, the second method can include changing a magnitude of the connected load to a second load magnitude. A second power transfer efficiency for the automatic power supply transfer switch can be determined based on (a) the power supplied to the connected load having the second load magnitude, and (b) the power supplied to the primary input of the automatic power supply transfer switch.

In many embodiments, the second method includes determining a reversion switching time for the automatic power supply transfer switch. For example, after controlling the primary power source selection assembly to stop supplying electrical power to the primary power input, the primary power source selection assembly can be controlled to restart supplying electrical power to the primary power input. A reversion switching time for the automatic power supply transfer switch is determined based on the time between (a) when supply of electrical power to the primary power input is restarted, and (b) when the automatic power supply transfer switch reverts to supplying electrical power received via the primary power input to the connected load.

In many embodiments of the second method, power is supplied to the automatic power supply transfer switch from two different sources. For example, a primary power source can be used to supply the electrical power to the primary power source selection assembly. And a secondary power source can be used to supply the electrical power to the secondary power input of the automatic power supply transfer switch, with the secondary power source being different from the primary power source.

In another aspect, a system is provided for testing an automatic power transfer switch. The system includes a primary power supply input, a primary power source selection assembly, a connected load power input, an electrical load unit, an output electrical power monitor unit, and a control unit. The primary power supply input is configured to receive electrical power. The primary power source selection assembly is electrically connected between the primary power supply input and a controlled primary power output configured to be electrically connected to a primary power input of the automatic power supply transfer switch. The power source selection assembly is controllable to enable selective communication of electrical power received via the primary power supply input to the controlled primary power output. The connected load power input is configured to be electrically connected to a power output of the automatic power supply transfer switch. The electrical load unit is electrically connected with the connected load power input. The electrical load unit is configured to consume electrical power supplied via the automatic power supply transfer switch. The output electrical power monitor unit is electrically connected with the electrical load unit and the connected load power input. The output electrical power monitor unit is configured to monitor the electrical power supplied to the electrical load unit via the automatic power supply transfer switch. The control unit is operatively coupled with the primary power source selection assembly and the electrical power monitor unit. The control unit is configured to: (a) control operation of the primary power source selection assembly to stop supply of electrical power to the controlled primary power output, (b) receive output from the electrical power monitor unit indicative of the electrical power monitored by the electrical power monitor unit, and (c) determine a switching time for the automatic power supply transfer switch based at least in part on the power supplied to the electrical load unit via the automatic power supply transfer switch.

In many embodiments of the system, electrical relays are used to control supply of electrical power to the automatic power transfer switch being tested. For example, the primary power source selection assembly can include one or more relays controlled via the control unit to control communication of the electrical power received via the primary power supply unit to the controlled primary power output.

In many embodiments, the system is configured to test power transfer efficiency of the automatic power transfer switch. For example, the system can include an input electrical power monitor unit electrically connected with the primary power source selection assembly and the controlled primary power output. The input electrical power monitor unit can be configured to monitor the electrical power supplied to the primary power supply input of the automatic power supply transfer switch. The control unit can be operatively coupled with the input electrical power monitor unit to receive output indicative of the power monitored by the input electrical power monitor unit. The control unit can be configured to determine a power transfer efficiency for the automatic power supply transfer switch based on (a) the power monitored by the output electrical power monitor unit, and (b) the power monitored by the input electrical power monitor unit. In many embodiments, the output power monitor unit and/or the input power monitor unit are/is configured to measure voltage and current.

In many embodiments of the system, the magnitude of the electrical load of the electrical load unit is selectable. For example, the electrical load unit can include a plurality of load elements that can be connected in selectable combinations to enable different magnitudes of the electrical load. In many embodiments, the control unit controls operation of the electrical load unit.

In many embodiments, the system is configured to simultaneously test two or more power supply transfer switches. For example, the system can be configured to simultaneously test a plurality of power supply transfer switches to determine a switching time for each of the plurality of power supply transfer switches.

In many embodiments, the system includes a housing enclosing components of the system. For example, the housing can at least partially enclosing an internal volume in which the primary power source selection assembly, the electrical load unit, and the output electrical power monitor unit are disposed, as well as one or more cooling fans configured to force cooling air through the housing.

In many embodiments, the system is configured to determine a reversion switching time for the automatic power supply transfer switch. For example, the control unit can be configured to: (a) control the primary power source selection assembly to restart supplying electrical power to the controlled primary power output, and (b) determine a reversion switching time for the automatic power supply transfer switch.

In another aspect, a device is provided for testing an automatic power transfer switch. The device includes a housing, a primary power supply input, a controlled primary power output, a connected load power input, an output electrical power monitor unit, and a control input. The primary power supply input is supported by the housing and configured to receive electrical power. The controlled primary power output is supported by the housing and configured to be electrically connected to a primary power input of the automatic power supply transfer switch. The primary power source selection assembly is supported by the housing and electrically connected between the primary power supply input and the controlled primary power output. The power source selection assembly is controllable to enable selective communication of electrical power received via the primary power supply input to the controlled primary power output. The connected load power input is supported by the housing and configured to be electrically connected to a power output of the automatic power supply transfer switch. The output electrical power monitor unit is supported by the housing and configured to monitor electrical power supplied to a connected load via the connected load power input. The control input is supported by the housing and operatively coupled with the primary power source selection assembly and the output electrical power monitor unit to enable control of the operation of the primary power source selection assembly via an external controller and to transfer output from the output electrical power monitor unit to the external controller.

In many embodiments, the device includes an electrical load unit supported by the housing and electrically connected with the connected load power input. The electrical load unit is configured to consume electrical power supplied via the automatic power supply transfer switch.

In many embodiments, the device includes one or more cooling fans configured to force cooling air through the housing. The primary power source selection assembly, the output electrical power monitor unit, and/or the electrical load unit can be at least partially disposed within the housing and cooled via operation of the one or more cooling fans.

In many embodiments, the device includes an input electrical power monitor unit electrically connected with the primary power source selection assembly and the controlled primary power output. The input electrical power monitor unit is configured to monitor the electrical power supplied to the primary power supply input of the automatic power supply transfer switch. The control input can be operatively coupled with the input electrical power monitor unit to transfer output from the input electrical power monitor unit to the external controller.

Turning now to the drawings, in which the same reference numbers are used to refer to the same or similar elements, FIG. 1 schematically illustrates a system 10 for testing an automatic power supply transfer switch, in accordance with many embodiments. In the illustrated embodiment, the system 10 includes a test unit 12 and a computer 14 for testing an automatic power transfer switch 16. The system 10 can be configured to test performance attributes of the automatic power transfer switch 16, such as, for example: (a) a switching time for switching over to supply electrical power from a secondary electrical power source upon interruption of electrical power supply from a primary electrical power source, (b) a power transfer efficiency for the automatic power transfer switch 16, and/or (c) a reversion switching time for switching back to supply electrical power from the primary electrical power source following restarting of supply of electrical power from the primary electrical power source.

Typically, an automatic power transfer switch 16 includes a primary power input 18, a secondary power input 20, and a power output 22. The automatic power transfer switch 16 is configured to be connected to a primary electrical power source via the primary power input 18 and to a secondary electrical power source via the secondary power input 20. In the absence of failure of supply of electrical power from the primary electrical power source, the automatic power transfer switch 16 transfers electrical power received from a primary electrical power source via the primary power input 18 to a downstream electrical load via the power output 22. Upon a discontinuation of supply of electrical power from the primary electrical power source, the automatic power transfer switch 16 switches electrical coupling of the power output 22 from the primary power input 18 over to the secondary power input 20 so as to continue supplying electrical power to the downstream electrical load via the power output 22. In order to ensure effectively continuous supply of electrical power to the downstream electrical load, the automatic power transfer switch 16 may have a specified maximum switching time for switching over to supplying power via the secondary power input 20 upon discontinuation of power supplied to the primary power input 18. As a non-limiting example, the automatic power transfer switch 16 may have a specified maximum switching time of 16 milliseconds or less.

During testing, the automatic power transfer switch 16 is operatively coupled with the test unit 12. In the illustrated embodiment, the primary power input 18 of the automatic power transfer switch 16 is electrically connected to a controlled primary power output 24 of the test unit 12, the secondary power input 20 of the automatic power transfer switch 16 is electrically connected to a controlled secondary power output 26 of the test unit, and the power output 22 of the automatic power transfer switch 16 is electrically connected to a connected load power input 28 of the test unit 12.

In the illustrated embodiment, the test unit 12 is configured to receive electrical power from a primary electrical power source 30 (e.g., utility power) and from a secondary electrical power source 32 (e.g., backup power such as from one or more batteries and/or a backup generator). The test unit 12 includes a primary power input 34 and a secondary power input 36. During testing of the automatic power transfer switch 16, the primary electrical power source 30 is electrically connected to the primary power input 34 and secondary electrical power source 32 is electrically connected to the secondary power input 36.

The test unit 12 is configured for selective control of transmission of electrical power between the primary power input 34 and the controlled primary power output 24. The test unit 12 includes a primary power source selection assembly 38 having a power input 40 electrically connected to the primary power input 34 and a power output 42. The primary power source selection assembly 38 is controllable to electrically connect the power output 42 with the power input 40 and to electrically disconnect the power output 42 from the power input 40. For example, the primary power source selection assembly 38 can include electrical relays that can be controlled to connect the power output 42 with the power input 40 and to disconnect the power output 42 from the power input 40.

Control of the primary power source selection assembly 38 is effectuated via the computer 14. The test unit 12 includes a data acquisition/control interface unit 44 and a control/data interface connector 46. The data acquisition/control interface unit 44 operatively connects the primary power source selection assembly 38 to the control/data interface connector 46. A suitable data cable 48 (e.g., a USB cable) can be used to operatively coupled the computer 14 to the test unit 12 via the control/data interface connector 46. In many embodiments, the test unit 12 includes a USB hub so that there are more ports available to connect the computer 14 with components of the test unit 12.

The test unit 12 is configured to monitor electrical power delivered to the controlled primary power output 24 via the primary power source selection assembly 38. The test unit 12 includes an input primary electrical power monitor unit 50 configured to monitor the electrical power delivered to the controlled primary power output 24. The input primary electrical power monitor 50 includes a power input 52 electrically connected with the power output 42 of the primary power source selection assembly 38 and a power output 54 electrically connected with the controlled primary power output 24. In many embodiments, the input primary electrical power monitor unit 50 includes a voltage sensor to measure the voltage of the electrical power delivered to the controlled primary power output 24 and a current sensor to measure the current of the electrical power delivered to the controlled primary power output 24. The input primary electrical power monitor unit 50 is operatively coupled with the computer 14 via the data acquisition/control interface unit 44 to transfer data to the computer 14 indicative of the electrical power delivered to the controlled primary power output 24, such as the voltage and current for the electrical power delivered to the controlled primary power output 24.

The test unit 12 is configured for selective control of transmission of electrical power between the secondary power input 36 and the controlled secondary power output 26. The test unit 12 includes a secondary power source selection assembly 56 having a power input 58 electrically connected to the secondary power input 36 and a power output 60. The secondary power source selection assembly 56 is controllable to electrically connect the power output 60 with the power input 58 and to electrically disconnect the power output 60 from the power input 58. For example, the secondary power source selection assembly 56 can include electrical relays that can be controlled to connect the power output 60 with the power input 58 and to disconnect the power output 60 from the power input 58.

Control of the secondary power source selection assembly 56 is effectuated via the computer 14. The data acquisition/control interface unit 44 operatively connects the secondary power source selection assembly 38 to the control/data interface connector 46.

The test unit 12 is configured to monitor electrical power delivered to the controlled secondary power output 26 via the secondary power source selection assembly 56. The test unit 12 includes an input secondary electrical power monitor unit 62 configured to monitor the electrical power delivered to the controlled secondary power output 26. The input secondary electrical power monitor 62 includes a power input 64 electrically connected with the power output 60 of the secondary power source selection assembly 56 and a power output 66 electrically connected with the controlled secondary power output 26. In many embodiments, the input secondary electrical power monitor unit 62 includes a voltage sensor to measure the voltage of the electrical power delivered to the controlled secondary power output 26 and a current sensor to measure the current of the electrical power delivered to the controlled secondary power output 26. The input secondary electrical power monitor unit 56 is operatively coupled with the computer 14 via the data acquisition/control interface unit 44 to transfer data to the computer 14 indicative of the electrical power delivered to the controlled secondary power output 26, such as the voltage and current for the electrical power delivered to the controlled secondary power output 26.

The test unit 12 is configured to consume and monitor electrical power output by the automatic power transfer switch 16 being tested. The test unit 12 includes a load unit 68 and an output electrical power monitor unit 70. The load unit 68 is configured to consume electrical power supplied via the automatic power transfer switch 16. The output electrical power monitor unit 70 is configured to monitor electrical power supplied to the load unit 68 via the automatic power transfer switch 16. The output electrical power monitor unit 70 includes a power input 72 and a power output 74. The power input 72 is electrically connected with the connected load power input 28 of the test unit 12. The load unit 68 includes a power input 76 electrically connected with the power output 74 of the output electrical power monitor unit 70. In many embodiments, the output electrical power monitor unit 70 includes a voltage sensor to measure the voltage of the electrical power delivered to the load unit 68 and a current sensor to measure the current of the electrical power delivered to the load unit 68. The output electrical power monitor unit 70 is operatively coupled with the computer 14 via the data acquisition/control interface unit 44 to transfer data to the computer 14 indicative of the electrical power delivered to the load unit 68, such as the voltage and current for the electrical power delivered to the load unit 68.

In many embodiments, the load unit 68 is configured with a plurality of electrical load elements that can be selectively connected via control effectuated via the computer 14 so as to present different selectable electrical load magnitudes driven by power output by the automatic power transfer switch 16. For example, each of the electrical load elements can be selected via control of an associated electrical relay configured to selectively connect and disconnect the electrical load element to the power input 76 of the load unit 68.

In the illustrated embodiment, the test unit 12 includes one or more cooling fans 78 for cooling the test unit 12. The one or more cooling fans 78 can be powered via any suitable power source, such as via electrical power received via the primary power input 34 of the test unit 12 in the illustrated embodiment. The one or more cooling fans 78 can include a thermostatic control device to control operation of the one or more cooling fans in a suitable manner based on a temperature of the test unit 12.

Figure 2:
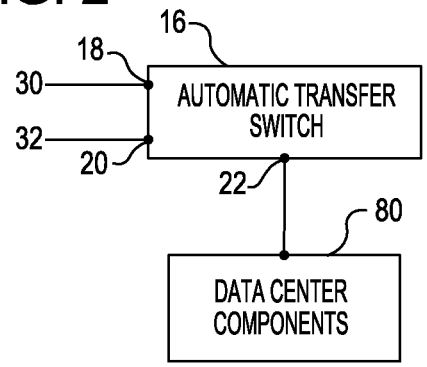
FIG. 2 schematically illustrates data center components being supplied electrical power via an automatic power supply transfer switch.

FIG. 2 schematically illustrates an exemplary usage of an automatic power transfer switch 16. In the illustrated exemplary usage, data center components 80 are supplied electrical power via the automatic power transfer switch 16. A primary electrical power source 30 is connected to the primary power input 18 of the automatic power transfer switch 16. A secondary electrical power source 32 is connected to the secondary power input 20 of the automatic power transfer switch 16. The data center components 80 are electrically connected with the power output 22 of the automatic power transfer switch 16. In many implementations, the data center components 80 provide critical functionality having a desired availability and the automatic power transfer switch 16 is employed to avoid loss of function that would otherwise occur in the event of a primary power source outage without the availability of automatically supplied secondary electrical power.

Figure 3:
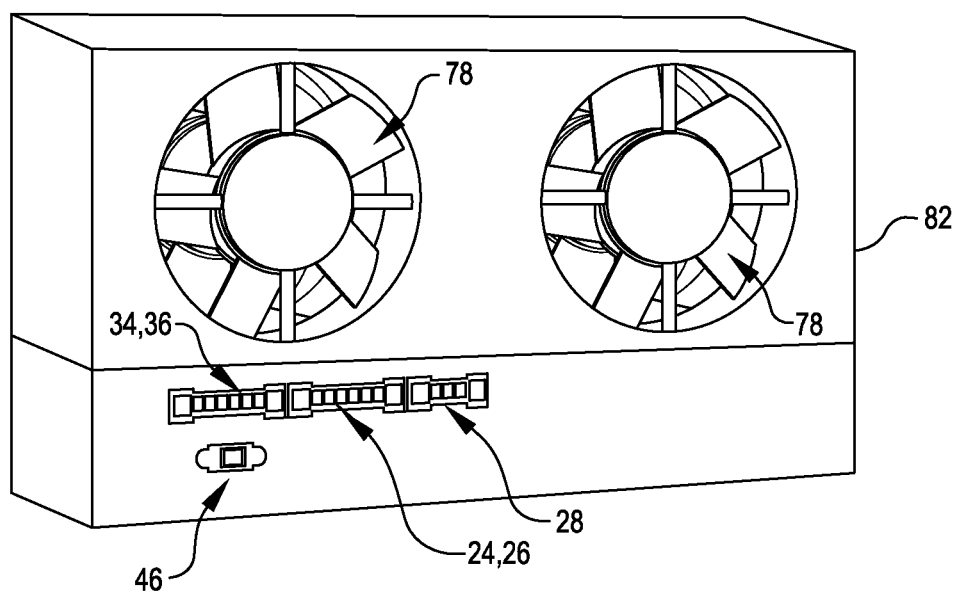
FIG. 3 illustrates a test unit for testing an automatic power supply transfer switch, in accordance with many embodiments.

FIG. 3 illustrates an embodiment of the test unit 12. The illustrated embodiment of the test unit 12 includes a housing 82 that supports and may enclose components of the test unit 12. For example, the housing 82 can be configured to support a suitable connector (e.g., contacts manufactured by Phoenix Contact GmbH & Co. KG) for the primary power input 34 and the secondary power input 36, a suitable connector for the controlled primary power output 24 and the controlled secondary power output 26, a suitable connector for the connected load power input 28, and a suitable connector (e.g., a USB port) for the control/data interface connector 46. The housing 82 can support and may partially or fully enclose the primary power source selection assembly 38, the secondary power source selection assembly 56, the input primary electrical power monitor unit 50, the input secondary electrical power monitor unit 62, the data acquisition/control interface unit 44, the load unit 68, the output electrical power monitor unit 70, and the one or more cooling fans 78. Any suitable number of cooling fans 78 (one, two, three, four, five, six, or more) can be employed, such as two in the illustrated embodiment.

Figure 4:
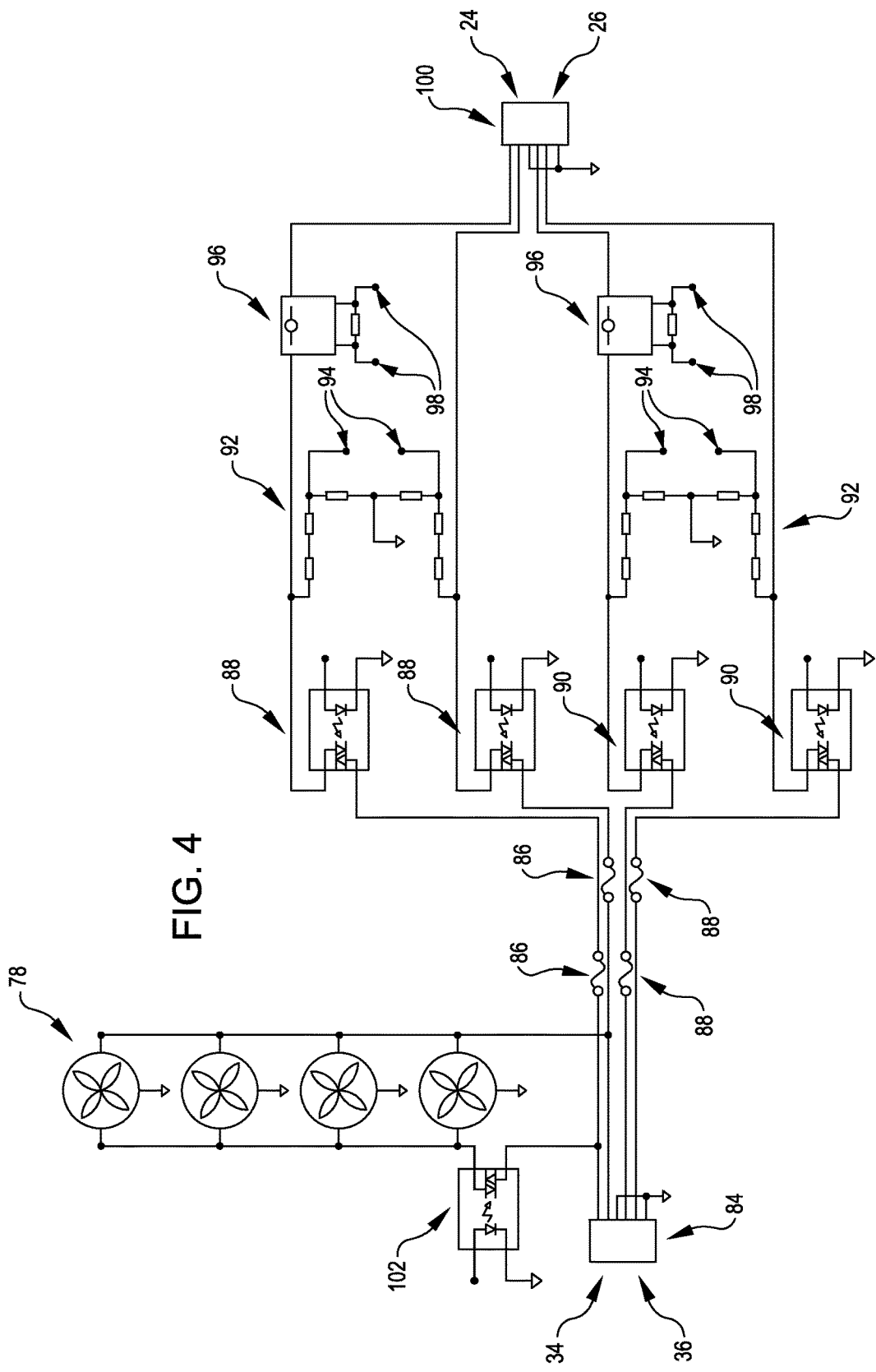
FIG. 4 and FIG. 5 show a circuit diagram of a test unit for testing an automatic power supply transfer switch, in accordance with many embodiments.
Figure 5:
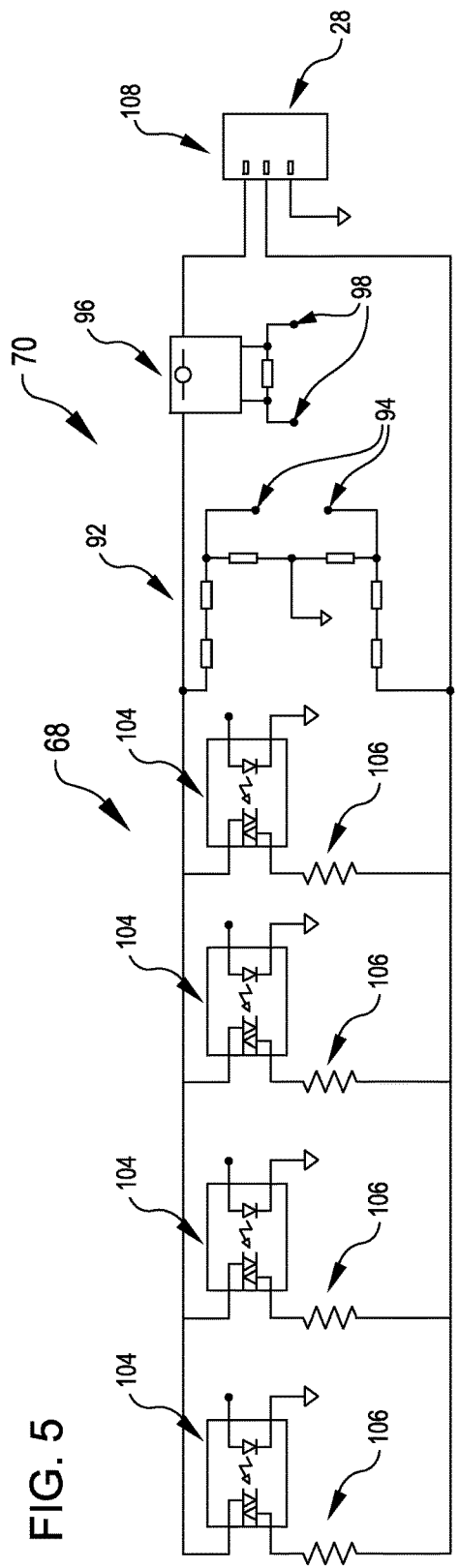
Figure 6B:
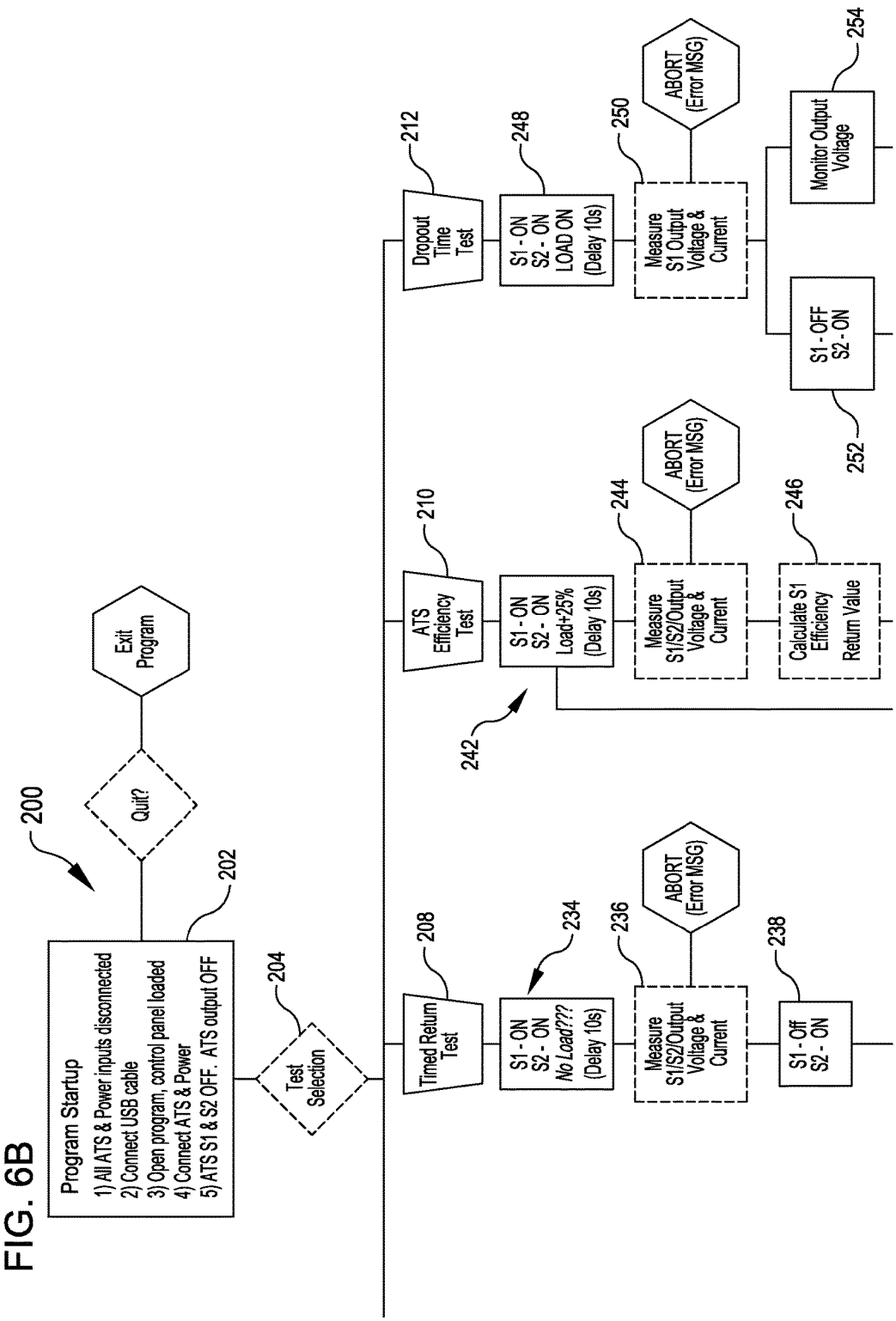
FIG. 6 schematically illustrates a computer-implemented method for controlling a test unit used to test an automatic power supply transfer switch, in accordance with many embodiments. The figure is shown in expanded version in FIGS. 6*a*-6*e*.
Figure 6C:
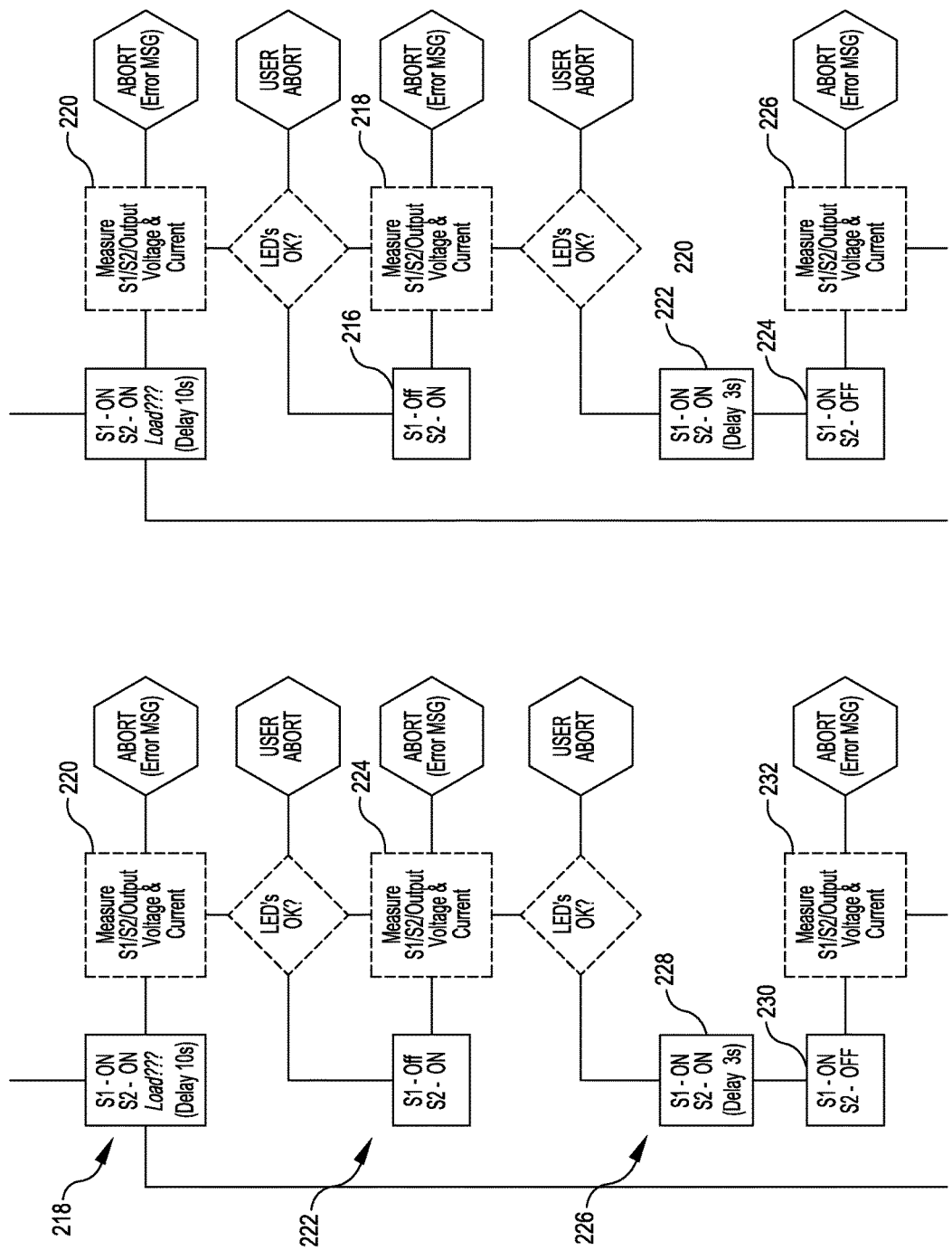
Figure 6D:
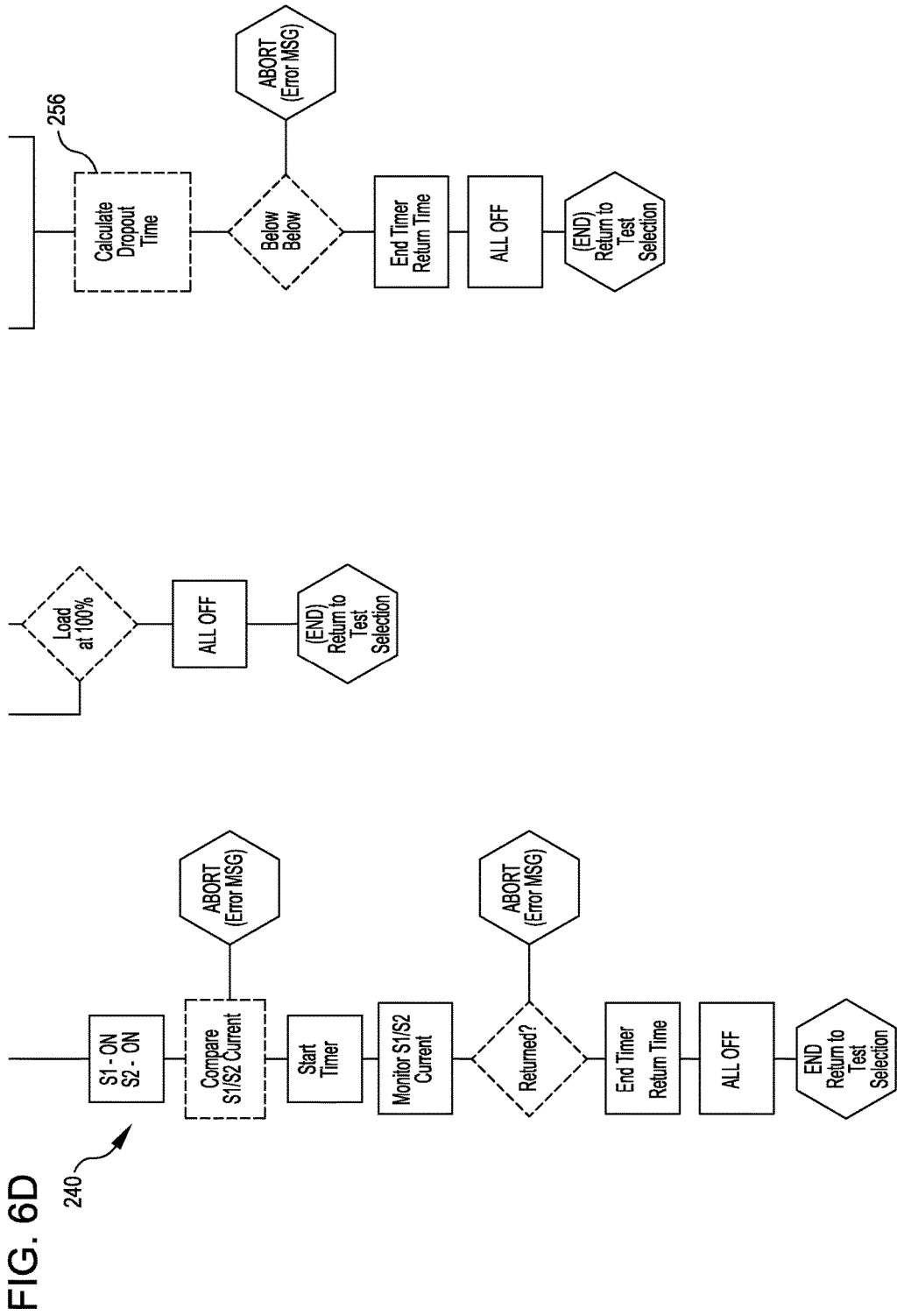
Figure 6E:
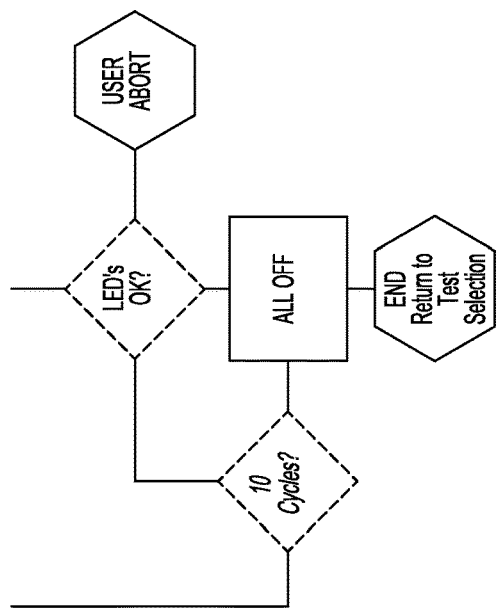
Figure 6E:
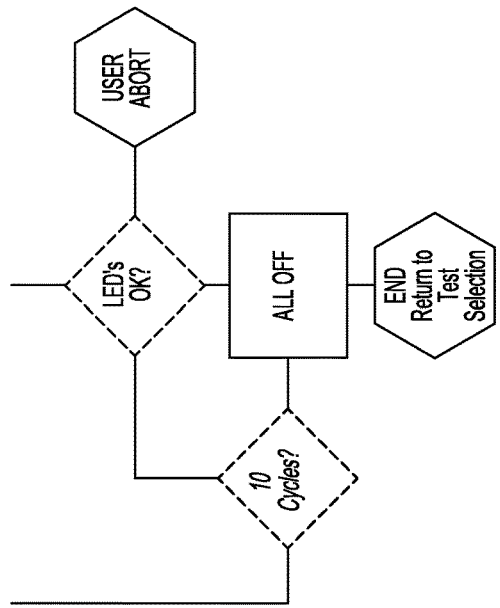

FIG. 4 and FIG. 5 show a circuit diagram of an embodiment of the test unit 12. Referring first to FIG. 4, a connector 84 is used to provide the primary power input 34 and the secondary power input 36. Primary fuses 86 and secondary fuses 88 are employed to protect downstream components of the test unit 12 from electrical overload. In the illustrated embodiment, primary power relays 88 serve as the primary power source selection assembly 38, and secondary power relays 90 serve as the secondary power source selection assembly 56. Resistive networks 92 are used to provide voltage measurement points 94 for each of the primary electrical power output to the automatic power transfer switch 16 via the controlled primary power output 24 and the secondary electrical power output to the automatic power transfer switch 16 via the controlled secondary power output 26. Current measurement devices 96 are used to measure current for each of the primary electrical power output to the automatic power transfer switch 16 via the controlled primary power output 24 and the secondary electrical power output to the automatic power transfer switch 16 via the controlled secondary power output 26. The voltage measurement points 94 and current measurement points 98 are operatively connected with the computer 14 via the data acquisition/control interface unit 44 and the control/data interface connector 46. A connector 100 is used to provide the controlled primary power output 24 and the controlled secondary power output 29. In the illustrated embodiment, the one or more fans 78 include four fans driven by electrical power received via the primary power input 34 and controlled by a relay 102 controlled by the computer 14. The relay 102 is connected to the computer 14 via the data acquisition/control interface unit 44 and the control/data interface connector 46.

FIG. 5 shows a circuit diagram of the test unit 12 for the load unit 68 and the output electrical power monitor unit 70. In the illustrated embodiment of the test unit 12, the load unit 68 includes four relays 104 that are controlled via the computer 14 to selectively connect resistive loads 106 to be driven via electrical power output from the automatic power transfer switch 16. Any suitable magnitude of the resistive loads 106 can be used. For example, in one embodiment, each of the resistive loads 106 has a one kilowatt magnitude thereby providing the ability for the load unit to present a selectable connected load of one, two, three, and four kilowatts. A resistive network 92 is used to provide voltage measurement points 94 for the electrical power output by the automatic power transfer switch 16 to the load unit 68. A current measurement device 96 is used to measure current for the electrical power output by the automatic power transfer switch 16 to the load unit 68. The voltage measurement points 94 and current measurement points 98 are operatively connected with the computer 14 via the data acquisition/control interface unit 44 and the control/data interface connector 46. A connector 108 is used to provide the connected load power input 28 of the test unit 12.

FIG. 6 schematically illustrates a computer-implemented process 200 for controlling the test unit 12 to test an automatic power supply transfer switch 16, in accordance with many embodiments. The figure is shown in expanded version in FIGS. 6a-6e. Some or all of the process 200 (or any other processes described herein, or variations and/or combinations thereof) may be performed under the control of one or more computer systems (e.g., computer 14) configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The process 200 includes a program startup phase 202. Starting with the automatic power transfer switch 16 decoupled from the test unit 12 and the test unit 12 decoupled from the primary and secondary power sources 30, 32, the computer 14 is connected to the control/data interface connector 46 via the data cable 48. Execution of the computer program is started resulting in the display of a control panel. The automatic power transfer switch 16 is then coupled with the test unit 12 and the test unit 12 is coupled with the primary and secondary power sources 30, 32 as described herein. With each of the primary power source selection assembly 38 and the secondary power source selection assembly 56 controlled to not transmit electrical power to the automatic power transfer switch 16, the output electrical power monitor unit 70 is used to verify that no electrical power is being output by the automatic power transfer switch 16 to the load unit 68.

The process 200 includes a test selection phase 204 by which a desired test can be selected to be run on the automatic power transfer switch 16. In the illustrated embodiments, the available tests include a source 1 to source 2 flip test 206, a time return test 208, an efficiency test 210, and a dropout time test 212.

The source 1 to source 2 flip test 206 is used to test that the automatic power transfer switch 16 will switch over from outputting power received via the controlled primary power output 24 of the test unit 12 to outputting power received via the controlled secondary power output 26 of the test unit 12 upon discontinuation of supply of electrical power via the controlled primary power output 24. The source 1 to source 2 flip test 206 also is used to test that the automatic power transfer switch 16 reverts back to outputting power received via the controlled primary output 24 when power is available via the primary power source and electrical power supply from the secondary power source is discontinued. The number of test cycles to accomplish for the flip test 206 can be input (act 214). Another input that can be made is whether the flip test 206 is conducted with a load connected to the automatic power transfer switch 16 via the load unit 68 or unloaded (act 216).

The test 206 starts at phase 218 in which each of the primary power source selection assembly 38 and the secondary power source selection assembly 56 is controlled to transmit electrical power to the automatic power transfer switch 16 for a suitable period of time (e.g., ten seconds) and the input primary electrical power monitor unit 50, the input secondary electrical power monitor unit 62, and the output electrical power monitor unit 70 are used to measure respective voltage and current. The voltages and currents measured in phase 212 (act 220) are processed to check if the automatic power transfer switch 16 is transmitting electrical power received via the controlled primary power output 24 of the test unit 12 and not from the controlled secondary power output 26 of the test unit 12.

In phase 222 of the test 206, the primary power source selection assembly 38 is controlled to discontinue supply of electrical power to the automatic power transfer switch 16 via the controlled primary power output 24 of the test unit. The input primary electrical power monitor unit 50, the input secondary electrical power monitor unit 62, and the output electrical power monitor unit 70 are used to measure respective voltage and current during phase 222. The voltages and currents measured in phase 216 (act 224) are processed to verify that the automatic power transfer switch 16 switches from supplying electrical power to the load unit 68 from the controlled primary power output 24 of the test unit 12 to supplying electrical power to the load unit 68 from the controlled secondary power output 26 of the test unit 12 in response to the discontinuation of the supply of electrical power to the controlled primary power output 24.

In phase 226 of the test 206, the primary power source selection assembly 38 is controlled to recommence supply of electrical power to the automatic power transfer switch 16 via the controlled primary power output 24 for a short time period (e.g., 3 seconds) (act 228). At the end of the short period of time, the secondary power source selection assembly 38 is then controlled to discontinue the supply of electrical power to the automatic power transfer switch 16 via the controlled secondary power output 26 (act 230). The input primary electrical power monitor unit 50, the input secondary electrical power monitor unit 62, and the output electrical power monitor unit 70 are used to measure respective voltage and current during phase 220. The voltages and currents measured in phase 226 (act 232) are processed to check if the automatic power transfer switch 16 reverts to supplying electrical power to the load unit 68 from the controlled primary power output 24 of the test unit 12 in response to the discontinuation of supply of electrical power to the automatic power transfer switch 16 via the controlled secondary power output 26. The phase 226 testing is used to verify that an automatic transfer switch will switch back to transmitting power received via the controlled primary power output 24 in response to the discontinuation of supply of electrical power to the automatic power transfer switch 16 via the controlled secondary power output 26. The phases 218, 222, 226 of the test 206 can then be repeated a suitable and/or selected number of times as desired to verify the corresponding functionality of the automatic power transfer switch 16. Following completion of the test 206, control can revert back to the test selection phase 204.

The timed-return test 208 starts at phase 234 in which each of the primary power source selection assembly 38 and the secondary power source selection assembly 56 is controlled to transmit electrical power to the automatic power transfer switch 16 for a suitable period of time (e.g., ten seconds) and the input primary electrical power monitor unit 50, the input secondary electrical power monitor unit 62, and the output electrical power monitor unit 70 are used to measure respective voltage and current. The voltages and currents measured in phase 228 (act 236) are processed to check if the automatic power transfer switch 16 is transmitting electrical power received via the controlled primary power output 24 of the test unit 12 and not from the controlled secondary power output 26 of the test unit 12.

In act 238 of the test 208, the primary power source selection assembly 38 is controlled to discontinue supply of electrical power to the automatic power transfer switch 16 via the controlled primary power output 24 of the test unit 12 so as to induce the automatic power transfer switch 16 to switch to supplying power received via the controlled secondary power output 26 of the test unit 12 to the load unit 68. Then, in phase 240 of the test 208, the primary power source selection assembly 38 is controlled to restart supply of electrical power to the automatic power transfer switch 16 via the controlled primary power output 24. A timer is started and the input primary electrical power monitor unit 50 and the input secondary electrical power monitor unit 62 are used to monitor corresponding voltage and current to measure the time it takes for the automatic power transfer switch 16 to revert to supplying power received via the controlled primary power output 24 to the load unit 68 while supply of electrical power to the automatic power transfer switch 16 via the controlled secondary power output 26 is continued. Following completion of the test 208, control can revert back to the test selection phase 204.

The efficiency test 210 starts at phase 242 in which the primary power source selection assembly 38 is controlled to transmit electrical power to the automatic power transfer switch 16 and the secondary power source selection assembly 56 is controlled to not transmit electrical power to the automatic power transfer switch 16. During phase 242, the input primary electrical power monitor unit 50 and the output electrical power monitor unit 70 are used to measure corresponding voltage and current (act 244), which are processed to calculate a primary power source transmission efficiency for the automatic power transfer switch 16 (act 246).

The efficiency test 210 can be conducted for any suitable number of load magnitudes. For example, in the illustrated embodiment, the load unit 68 includes four selectively connectable resistive loads 106 of equal magnitude (e.g., 1 kilowatt) such that the efficiency test 210 can be repeated for each of four separate load magnitudes (i.e., 25%, 50%, 75%, and 100% of the available total load magnitude of 4 kilowatts) so as to measure the power transfer efficiency of the automatic power transfer switch 16 for the four different load magnitudes.

The dropout time test 212 measures the amount of time it takes the automatic transfer switch to switch over to supplying power received via the controlled secondary power output 26 in response to discontinuation of supply of electrical power received via the controlled primary power output 24. The dropout time test 212 begins with power being supplied to the automatic power transfer switch via both of the controlled primary power output 24 and the controlled secondary power output 26 (act 248). The input primary electrical power monitor unit 50, the input secondary electrical power monitor unit 62, and the output electrical power monitor unit 70 are used to measure respective voltage and current to verify that the automatic power transfer switch 16 is supplying electrical power received via the controlled primary power output 24 to the load unit 68 (act 250). The electrical power supplied to the controlled primary power output 24 is then stopped (act 252) and the output power monitor unit 70 is used to measure output voltage and current that is processed to measure how long it takes the automatic power transfer switch 16 to switch over to outputting electrical power received via the controlled secondary power output 26 after stopping the supply of electrical power via the controlled primary power output 24 (act 254). Following completion of the dropout time test 212, control can revert back to the test selection phase 204.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A system for testing an automatic power supply transfer switch, the system comprising:
   a primary power supply input configured to receive electrical power;
   a primary power source selection assembly electrically connected between the primary power supply input and a controlled primary power output configured to be electrically connected to a primary power input of the automatic power supply transfer switch, the primary power source selection assembly being controllable to enable selective communication of electrical power received via the primary power supply input to the controlled primary power output;
   a connected load power input configured to be electrically connected to a power output of the automatic power supply transfer switch;
   an electrical load unit electrically connected with the connected load power input, the electrical load unit being configured to consume electrical power supplied via the automatic power supply transfer switch;
   an output electrical power monitor unit electrically connected with the electrical load unit and the connected load power input, the output electrical power monitor unit being configured to monitor the electrical power supplied to the electrical load unit via the automatic power supply transfer switch; and
   a control unit operatively coupled with the primary power source selection assembly and the electrical power monitor unit, the control unit being configured to:
      control operation of the primary power source selection assembly to stop supply of electrical power to the controlled primary power output;
      receive output from the electrical power monitor unit indicative of the electrical power monitored by the electrical power monitor unit; and determine a switching time for the automatic power supply transfer switch based at least in part on the power supplied to the electrical load unit via the automatic power supply transfer switch, wherein the system is separate from and operatively connectable with the automatic power supply transfer switch for testing of the automatic power supply transfer switch.

2. The system of claim 1, further comprising:

an input electrical power monitor unit electrically connected with the primary power source selection assembly and the controlled primary power output, the input electrical power monitor unit being configured to monitor the electrical power supplied to the primary power supply input of the automatic power supply transfer switch;

and wherein the control unit is:

operatively coupled with the input electrical power monitor unit to receive output indicative of the power monitored by the input electrical power monitor unit; and configured to determine a power transfer efficiency for the automatic power supply transfer switch based on the power monitored by the output electrical power monitor unit and based on the power monitored by the input electrical power monitor unit.

3. The system of claim 1, wherein:

the electrical load unit comprises a plurality of load elements that can be connected in selectable combinations to enable different magnitudes of the electrical load of the electrical load unit; and the control unit controls operation of the electrical load unit.

4. The system of claim 1, configured to simultaneously test a plurality of automatic power supply transfer switches to determine a switching time for each of the plurality of automatic power supply transfer switches.

5. The system of claim 1, comprising:

a housing at least partially enclosing an internal volume in which the primary power source selection assembly, the electrical load unit, and the output electrical power monitor unit are disposed; and one or more cooling fans configured to force cooling air through the housing.

6. The system of claim 1, wherein the control unit is configured to:

control the primary power source selection assembly to restart supplying electrical power to the controlled primary power output; and determine a reversion switching time for the automatic power supply transfer switch.

7. The system of claim 1, wherein the control unit is configured to:

after controlling the primary power source selection assembly to stop supplying electrical power to the primary power input of the automatic power supply transfer switch, controlling the primary power source selection assembly to restart supplying electrical power to the primary power input of the automatic power supply transfer switch;

controlling a secondary power source selection assembly to stop supplying electrical power to the secondary power input of the automatic power supply transfer switch; and based at least in part on the monitored power supplied to the connected load via the power output, determining if the automatic power supply transfer switch reverts to supplying electrical power received via the primary power input to the connected load in response to the stopping of supply of electrical power to the secondary power input.

8. A method for testing an automatic power supply transfer switch, the method comprising:

operatively connecting a device for testing an automatic power supply transfer switch to the automatic power supply transfer switch;

supplying electrical power to a secondary power input of the automatic power supply transfer switch;

supplying electrical power to a primary power source selection assembly of the device;

controlling, via a control unit, the primary power source selection assembly to supply electrical power to a primary power input of the automatic power supply transfer switch;

supplying electrical power to the device via the automatic power supply transfer switch;

controlling, via the control unit, the primary power source selection assembly to stop supplying electrical power to the primary power input of the automatic power supply transfer switch;

monitoring, via the control unit, the power supplied via the power output of the automatic power supply transfer switch to the device; and based at least in part on the monitored power supplied via the power output of the automatic power supply transfer switch to the device, measuring, via the control unit, a switching time for the automatic power supply transfer switch.

9. The method of claim 8, comprising:

monitoring, via the control unit, the power supplied to the primary input of the automatic power supply transfer switch; and determining, via the control unit, a power transfer efficiency for the automatic power supply transfer switch based on the power supplied to the device via the automatic power supply transfer switch and based on the power supplied to the primary input of the automatic power supply transfer switch.

10. The method of claim 8, comprising one or more cycles of the following:

after controlling the primary power source selection assembly to stop supplying electrical power to the primary power input of the automatic power supply transfer switch, controlling, via the control unit, the primary power source selection assembly to restart supplying electrical power to the primary power input of the automatic power supply transfer switch;

controlling, via the control unit, a secondary power source selection assembly to stop supplying electrical power to the secondary power input of the automatic power supply transfer switch; and based at least in part on the monitored power supplied to the device via the power output, determining, via the control unit, if the automatic power supply transfer switch reverts to supplying electrical power received via the primary power input to the device in response to the stopping of supply of electrical power to the secondary power input.

11. The method of claim 8, comprising:

after said controlling the primary power source selection assembly to stop supplying electrical power to the primary power input, controlling, via the control unit, the primary power source selection assembly to restart supplying electrical power to the primary power input; and determining, via the control unit, a reversion switching time for the automatic power supply transfer switch based on the time between when supply of electrical power to the primary power input is restarted and when the automatic power supply transfer switch reverts to supplying electrical power received via the primary power input to the device.

12. The method of claim 8, wherein:

a primary power source supplies the electrical power to the primary power source selection assembly; and a secondary power source supplies the electrical power to the secondary power input of the automatic power supply transfer switch, the secondary power source being different from the primary power source.

13. A device for testing an automatic power supply transfer switch, the device comprising:

a housing;

a primary power supply input supported by the housing and configured to receive electrical power;

a controlled primary power output supported by the housing and configured to be electrically connected to a primary power input of the automatic power supply transfer switch;

a primary power source selection assembly supported by the housing and electrically connected between the primary power supply input and the controlled primary power output, the primary power source selection assembly including a primary power control input and being controllable, via the primary power control input, to enable selective communication of electrical power received via the primary power supply input to the controlled primary power output;

a connected load power input supported by the housing and configured to be electrically connected to a power output of the automatic power supply transfer switch;

an output electrical power monitor unit supported by the housing and configured to monitor electrical power supplied to a connected load via the connected load power input; and a control input supported by the housing and operatively coupled with the primary power control input and the output electrical power monitor unit to enable control of the operation of the primary power source selection assembly via an external controller and to transfer output from the output electrical power monitor unit to the external controller, wherein the device is separate from and operatively connectable with the automatic power supply transfer switch for testing of the automatic power supply transfer switch.

14. The device of claim 13, further comprising an electrical load unit supported by the housing and electrically connected with the connected load power input, the electrical load unit being configured to consume electrical power supplied via the automatic power supply transfer switch.

15. The device of claim 14, wherein the electrical load unit comprises a plurality of load elements that can be connected in selectable combinations to enable different magnitudes of the electrical load of the electrical load unit.

16. The device of claim 15, wherein the external controller controls operation of the electrical load unit.

17. The device of claim 16, further comprising the external controller, the external controller being operatively connected or connectable to the control input and configured to:

control operation of the primary power source selection assembly, via the primary power control input, to stop supply of electrical power to the controlled primary power output;

receive output from the output electrical power monitor unit indicative of the electrical power monitored by the output electrical power monitor unit; and measure a switching time for the automatic power supply transfer switch based at least in part on the power supplied to the electrical load unit via the automatic power supply transfer switch.

18. The device of claim 14, comprising one or more cooling fans configured to force cooling air through the housing; and wherein each of the: (1) the primary power source selection assembly, (2) the output electrical power monitor unit, and (3) the electrical load unit is at least partially disposed within the housing.

19. The device of claim 13, comprising an input electrical power monitor unit electrically connected with the primary power source selection assembly and the controlled primary power output, the input electrical power monitor unit being configured to monitor the electrical power supplied to the primary power supply input of the automatic power supply transfer switch; and wherein the control input is operatively coupled with the input electrical power monitor unit to transfer output from the input electrical power monitor unit to the external controller.

20. The device of claim 13, wherein the automatic power supply transfer switch is configured for supplying electrical power to datacenter components.

* * * * *